US008193865B2

(12) United States Patent
Nishimura

(10) Patent No.: US 8,193,865 B2
(45) Date of Patent: Jun. 5, 2012

(54) OUTPUT CIRCUIT USING ANALOG AMPLIFIER

(75) Inventor: Kouichi Nishimura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 122 days.

(21) Appl. No.: 12/662,626

(22) Filed: Apr. 26, 2010

(65) Prior Publication Data
US 2010/0271129 A1   Oct. 28, 2010

(30) Foreign Application Priority Data

Apr. 27, 2009   (JP) ................................ 2009-108338

(51) Int. Cl.
*H03F 1/52* (2006.01)
*H03F 1/14* (2006.01)
(52) U.S. Cl. .......................... 330/298; 330/255; 330/292
(58) Field of Classification Search ............... 330/207 P, 330/255, 292, 298
See application file for complete search history.

(56) References Cited

U.S. PATENT DOCUMENTS

| 5,877,655 | A | * | 3/1999 | Maige ........................... 330/298 |
| 6,433,407 | B2 | | 8/2002 | Gotoh et al. |
| 2001/0050411 | A1 | | 12/2001 | Gotoh et al. |

FOREIGN PATENT DOCUMENTS

JP   2001-358300 A   12/2001
* cited by examiner

*Primary Examiner* — Steven J Mottola
(74) *Attorney, Agent, or Firm* — McGinn Intellectual Property Law Group, PLLC

(57) ABSTRACT

An output circuit includes an analog amplifier circuit including a differential amplifier stage configured to receive an input voltage, and first to $n^{th}$ output systems (n is a natural number more than 1); first to $n^{th}$ output nodes; an output pad; and first to $n^{th}$ electrostatic protection resistances. An $i^{th}$ output system (i is a natural number between 2 and n) of the first to $n^{th}$ output systems includes an $i^{th}$ PMOS transistor having a drain connected with the $i^{th}$ output node of the first to $n^{th}$ output nodes and a gate connected with a first output of the differential amplifier stage; and an $i^{th}$ NMOS transistor having a drain connected with the $i^{th}$ output node and a gate connected with a second output of the differential amplifier stage. The first to $n^{th}$ electrostatic protection resistances are respectively connected between the first to $n^{th}$ output nodes and the output pad.

18 Claims, 7 Drawing Sheets

OUTPUT CIRCUIT USING ANALOG AMPLIFIER

INCORPORATION BY REFERENCE

This application claims a priority on convention based on Japanese Patent Application No. 2009-108338. The disclosure thereof is incorporated herein by reference.

TECHNICAL FIELD

The present invention relates to an output circuit, and more particularly relates to a technique for reducing influence of an electrostatic protection resistance connected to a pad in an output circuit using an analog amplifier.

BACKGROUND ART

Generally, in an output circuit of an integrated circuit, an electrostatic protection resistance is inserted in series between an output stage and an output pad. When the electrostatic protection resistance is not inserted in series, a size of a transistor in the output stage must be increased or an output transistor must have an electrostatic protection element. However, as a result of them, a parasitic capacitance increases, a chip size increases, or a desired characteristic cannot be accomplished.

When the electrostatic protection resistance is inserted in series between the output stage and the pad, a resistance value of the electrostatic protection resistance is set to be in a range where a condition defined for protection of an internal transistor from static electricity is satisfied. The electrostatic protection resistance is generally set to a resistance value of tens of Ω to hundreds of Ω. When the resistance value is smaller than this range, the electrostatic protection standards defined in MIL (Military) standards and EIAJ (Electronic Industries Association of Japan) cannot be satisfied.

However, when the electrostatic protection resistance is connected to the output circuit, the output characteristic reduces. The reduction of output characteristic when the electrostatic protection resistance is connected to the output circuit will be described below.

FIG. 1 is a diagram showing an output circuit using an operational amplifier. In the output circuit shown in FIG. 1, an electrostatic protection resistance $R_{ESD}$ is connected between an output of an analog amplifier circuit 101 and an output pad 102. The analog amplifier circuit 101 includes a differential amplifier stage 103 and the output stage 104. The output stage 104 includes a PMOS transistor $MP_1$ having a source connected to a power supply of a positive power supply voltage $V_{DD}$ and an NMOS transistor $MN_1$ having a source connected to a power supply of a negative power supply voltage $V_{SS}$. Two outputs of the differential amplifier stage 103 are connected to the respective gates of the PMOS transistor $MP_1$ and the NMOS transistor $MN_1$. One end of the electrostatic protection resistance $R_{ESD}$ is commonly connected to the respective drains of the PMOS transistor $MP_1$ and the NMOS transistor $MN_1$, and the other end is connected to the output pad 102. The one end of the electrostatic protection resistance $R_{ESD}$ is connected to an inversion input terminal of the differential amplifier stage 103, and a feedback operation is perform. The output stage 104 further includes phase compensation capacitances $C_P$ and $C_N$. Respective one ends of the phase compensation capacitances $C_P$ and $C_N$ are connected to the respective drains of the PMOS transistor $MP_1$ and the NMOS transistor $MN_1$, and respective other ends of the phase compensation capacitances $C_P$ and $C_N$ are connected to the differential amplifier stage 103.

It should be noted that for the electrostatic protection, an electrostatic protective diode is generally used in parallel actually in addition to the electrostatic protection resistance $R_{ESD}$. However, since the diode is not directly related to the present invention, illustration of it is removed and the description of it is omitted.

In the circuit configuration shown in FIG. 1, the commonly-connected drains of the PMOS transistor $MP_1$ and the NMOS transistor $MN_1$ are an output of the analog amplifier circuit 101. Since the feedback operation is performed from this output to the inversion input terminal, a so-called voltage follower connection is configured and a same voltage as a voltage supplied to a non-inversion input terminal is outputted from the output of the analog amplifier circuit 101. Then, the voltage outputted from the analog amplifier circuit 101 is finally outputted from the output pad 102 via the electrostatic protection resistance $R_{ESD}$. In the circuit configuration shown in FIG. 1, an output waveform is degraded due to an influence of the electrostatic protection resistance $R_{ESD}$. FIG. 2 is illustrated by plotting output waveforms when a rectangular wave is supplied to the non-inversion input terminal of the analog amplifier circuit 101 in the state that a value of the electrostatic protection resistance $R_{ESD}$ changed. As understood from FIG. 2, as the electrostatic protection resistance $R_{ESD}$ becomes larger, the output waveform becomes duller. When the electrostatic protection resistance $R_{ESD}$ is zero, the characteristic ideally becomes the best. However, since the electrostatic protection resistance $R_{ESD}$ of the resistance value determined to satisfy the standard has to be inserted actually, the output characteristic is consequently limited by the electrostatic protection resistance $R_{ESD}$.

On the other hand, a technique for reducing influence of an electrostatic protection resistance in an output circuit of a digital circuit is disclosed in Japanese Patent Publication (JP 2001-358300A: patent literature 1). Referring to FIG. 3, the output circuit described in the patent literature 1 will be described. The output circuit shown in FIG. 3 includes n PMOS transistors $MP_1$ to $MP_n$, n NMOS transistors $MN_1$ to $MN_n$, PMOS electrostatic protection resistances $R_{P1}$ to RPn, NMOS electrostatic protection resistances $R_{N1}$ to $R_{Nn}$, an internal circuit 105, an output terminal pad 106, and an inverter 107. The PMOS transistors $MP_1$ to $MP_n$ are commonly connected to a power supply of a positive power supply voltage $V_{DD}$ at their sources, and the NMOS transistors $MN_1$ to $MN_n$ are commonly connected to a power supply of a negative power supply voltage $V_{SS}$ at their sources. The PMOS electrostatic protection resistances are respectively connected to drains of the PMOS transistors $MP_1$ to $MP_n$, and the NMOS electrostatic protection resistances for $R_{N1}$ to $R_{Nn}$ are respectively connected to drains of the NMOS transistors $MN_1$ to $MN_n$. The inverter 107 is connected to the output terminal pad 106 at the input, and is connected to the internal circuit 105 at the output. The respective gates of the PMOS transistors $MP_1$ to $MP_n$ and the respective gates of the NMOS transistors $MN_1$ to $MN_n$ are commonly connected to the output of the internal circuit 105. In addition, the PMOS electrostatic protection resistances $R_{P1}$ to $R_{Pn}$ are connected between the drains of the PMOS transistors $MP_1$ to $MP_n$ and the output terminal pad 106, and the NMOS electrostatic protection resistances $R_{N1}$ to $R_{Nn}$ are connected between the drains of the NMOS transistors $MN_1$ to $MN_n$ and the output terminal pad 106.

Referring to FIG. 3, the PMOS electrostatic protection resistances $R_{P1}$ to $R_{Pn}$ and the NMOS electrostatic protection resistances $R_{N1}$ to $R_{Nn}$ are inserted in order to avoid destruction of the MOS transistors due to electrostatic surge, and the resistance values thereof are approximately tens of Ω to hundreds of Ω in general depending on a device process. The resistance values of the electrostatic protection resistances $R_{P1}$ to $R_{Pn}$ and $R_{N1}$ to $R_{Nn}$ vary depending on actual values of the respective device processes, but are required to be set to resistance values satisfying the standard. A voltage drop due to the electrostatic protection resistance causes the characteristic degradation of the output circuit as described above. However, by connecting a plurality of the MOS transistors in parallel as shown in FIG. 3, a current can be distributed into n electrostatic protection resistances. That is, the current flowing through one electrostatic protection resistance is 1/n of the original current. In this manner, the voltage drop due to the current flowing through the respective electrostatic protection resistance also is 1/n, and thus the characteristic degradation of the output circuit can be prevented.

Citation List:
  Patent Literature 1: JP 2001-358300A

SUMMARY OF THE INVENTION

The circuit shown in FIG. 3 is an application example to the output circuit in a digital circuit, and the circuit configuration shown in FIG. 3 cannot be applied to the output circuit of an analog circuit with no change. Specifically, a current called an idling current always flows through the output circuit of the analog circuit. This is equivalent to, for example, a current flowing from the drain of the PMOS transistor $MP_1$ to the drain of the NMOS transistor $MN_1$ in FIG. 3. This idling current is peculiar to the analog circuit, and is essential to a phase margin of a feedback amplifier. In a case of applying the example shown in FIG. 3 to the analog circuit, a voltage drop by the electrostatic protection resistance due to the idling current prevents a desired output characteristic.

In an aspect of the present invention, an output circuit includes an analog amplifier circuit including a differential amplifier stage configured to receive an input voltage, and first to $n^{th}$ output systems (n is a natural number more than 1); first to $n^{th}$ output nodes; an output pad; and first to $n^{th}$ electrostatic protection resistances. An $i^{th}$ output system (i is a natural number between 2 and n) of the first to $n^{th}$ output systems includes an $i^{th}$ PMOS transistor having a drain connected with the $i^{th}$ output node of the first to $n^{th}$ output nodes and a gate connected with a first output of the differential amplifier stage; and an $i^{th}$ NMOS transistor having a drain connected with the $i^{th}$ output node and a gate connected with a second output of the differential amplifier stage. The first to $n^{th}$ electrostatic protection resistances are respectively connected between the first to $n^{th}$ output nodes and the output pad.

According to the present invention, an output characteristic can be improved, avoiding a voltage drop by an electrostatic protection resistance due to an idling current.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Hereinafter, an output circuit using an operational amplifier according to the present invention will be described in detail with reference to the attached drawings.

First Embodiment

Figure 4:
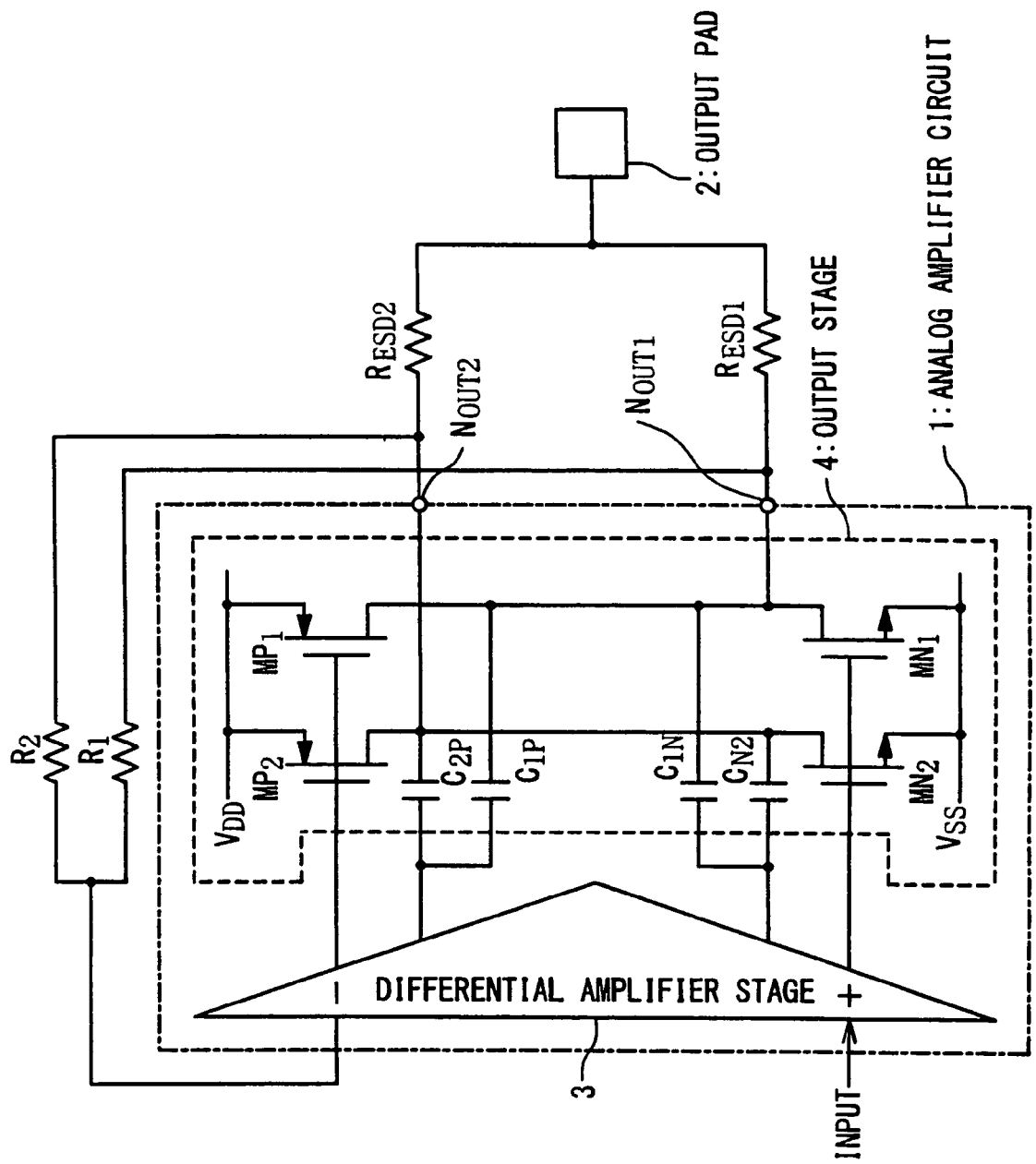
FIG. 4 is a circuit diagram showing a configuration of an output circuit according to a first embodiment of the present invention.

FIG. 4 is a circuit diagram showing a configuration of an output circuit according to a first embodiment of the present invention. The output circuit shown in FIG. 4 includes an analog amplifier circuit 1, an output pad 2, electrostatic protection resistances $R_{ESD1}$ and $R_{ESD2}$, and feedback resistances $R_1$ and $R_2$.

The analog amplifier circuit 1 includes a differential amplifier stage 3 and an output stage 4. The output stage 4 includes two output systems: one output system including a PMOS transistor $MP_1$ and a NMOS transistor $MN_1$ and the other output system including a PMOS transistor $MP_2$ and a NMOS transistor $MN_2$. In the present embodiment, the PMOS transistors $MP_1$ and $MP_2$ have a same W/L ratio, and the NMOS transistors $MN_1$ and $MN_2$ also have a same W/L ratio. Namely, the PMOS transistors $MP_1$ and $MP_2$ have a same driving performance, and the NMOS transistors $MN_1$ and $MN_2$ have a same driving performance.

Sources of the PMOS transistors $MP_1$ and $MP_2$ are commonly connected to a power supply of a positive power supply voltage $V_{DD}$, and the gates are commonly connected to one output of the differential amplifier stage 3. Similarly, sources of the NMOS transistors $MN_1$ and $MN_2$ are commonly connected to a power supply of a negative power supply voltage $V_{SS}$, and the gates are commonly connected to the other output of the differential amplifier stage 3. The respective drains of the PMOS transistor $MP_1$ and the NMOS transistor $MN_1$ of the output stage 4 are commonly connected to an output node $N_{out1}$ of the analog amplifier circuit 1, and the respective drains of the PMOS transistor $MP_2$ and the NMOS transistor $MN_2$ are commonly connected to an output node $N_{out2}$.

The electrostatic protection resistance $R_{ESD1}$ is connected between the output node $N_{out1}$ of the analog amplifier circuit 1 and the output pad 2, and the electrostatic protection resistance $R_{ESD2}$ is connected between the output node $N_{out2}$ of the analog amplifier circuit 1 and the output pad 2. In the present embodiment, the resistance values of the electrostatic protection resistances $R_{ESD1}$ and $R_{ESD2}$ are same. In addition, a feedback resistance $R_1$ is connected between the output node $N_{OUT1}$ and an inversion input terminal of the differential amplifier stage 3, and the feedback resistance $R_2$ is connected between the output node $N_{OUT2}$ and an inversion input terminal of the differential amplifier stage 3. In this connection, the feedback resistances $R_1$ and $R_2$ are commonly connected to the inversion input terminal of the differential amplifier stage 3 at the respective one ends. In the present embodiment, the resistance values of the feedback resistances $R_1$ and $R_2$ are same.

The output stage 4 further includes P-side phase compensation capacitances $C_{1P}$ and $C_{2P}$ and N-side phase compensation capacitances $C_{1N}$ and $C_{2N}$. The respective one ends of the P-side phase compensation capacitances $C_{1P}$ and the N-side phase compensation capacitances $C_{1N}$ are commonly connected to the output node $N_{OUT1}$. Similarly, the respective one ends of the P-side phase compensation capacitances $C_{2P}$ and the N-side phase compensation capacitances $C_{2N}$ are commonly connected to the output node $N_{OUT2}$. The other ends of the P-side phase compensation capacitances $C_{1P}$ and $C_{2P}$ are commonly connected to one output of the differential amplifier stage 3. Similarly, the other ends of the N-side phase compensation capacitances $C_{1N}$ and $C_{2N}$ are commonly connected to the other output of the differential amplifier stage 3.

An operation of the output circuit shown in FIG. 4 will be described below. The driving performances of PMOS transistors $MP_1$ and $MP_2$ are the same, the driving performances of NMOS transistors $MN_1$ and $MN_2$ are the same, and the resistance values of the electrostatic protection resistances $R_{ESD1}$ and $R_{ESD2}$ are the same. At this time, the output nodes $N_{out1}$ and $N_{out2}$ take a same potential.

Since the resistance values of the electrostatic protection resistances $R_{ESD1}$ and $R_{ESD2}$ are the same, the resistance values of the feedback resistances $R_1$ and $R_2$ are same, and a non-inversion input terminal and an inversion input terminal of the differential amplifier stage 3 are in an imaginary short state, the non-inversion input terminal and the counter-clockwise terminal have a same potential. That is, the voltage at a common connection point of the feedback resistances $R_1$ and $R_2$ and the input voltage to the non-inversion input terminal are equal to each other. Here, when there is no variation between elements, a current does not flow through the feedback resistances $R_1$ and $R_2$. In addition, as described above, the output nodes $N_{out1}$ and $N_{out2}$ have the same potential. Moreover, since the same current flows through the electrostatic protection resistances $R_{ESD1}$ and $R_{ESD2}$, a current flowing from the pad is distributed into these two systems. Specifically, halves of the current outputted from the pad are supplied from the output nodes $N_{out1}$ and $N_{out2}$, respectively. In this manner, the currents flowing through the electrostatic protection resistances $R_{ESD1}$ and $R_{ESD2}$ are a half of the required output current, compared to the conventional example. Accordingly, improvement of an output transient response waveform can be realized.

Figure 1:
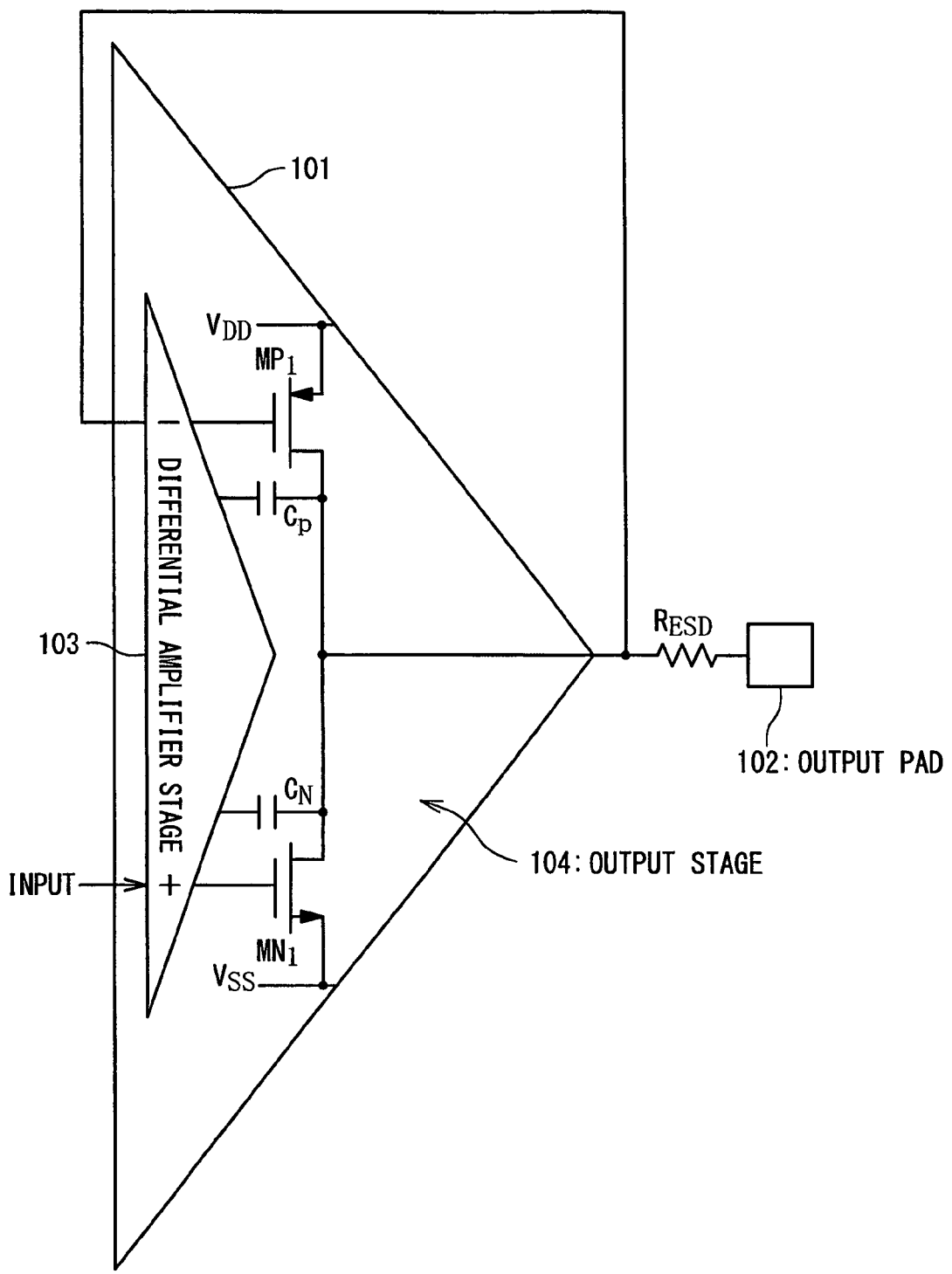
FIG. 1 is a circuit diagram showing a configuration of a conventional output circuit.
Figure 2:
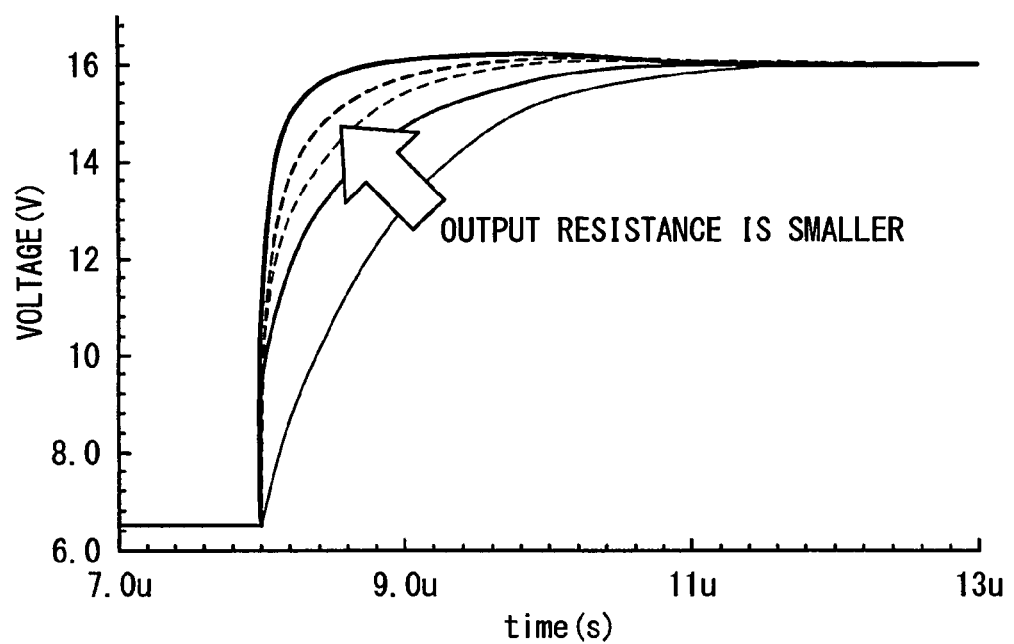
FIG. 2 is a diagram showing output voltage waveforms when a resistance value of an electrostatic protection resistance is varied.
Figure 3:
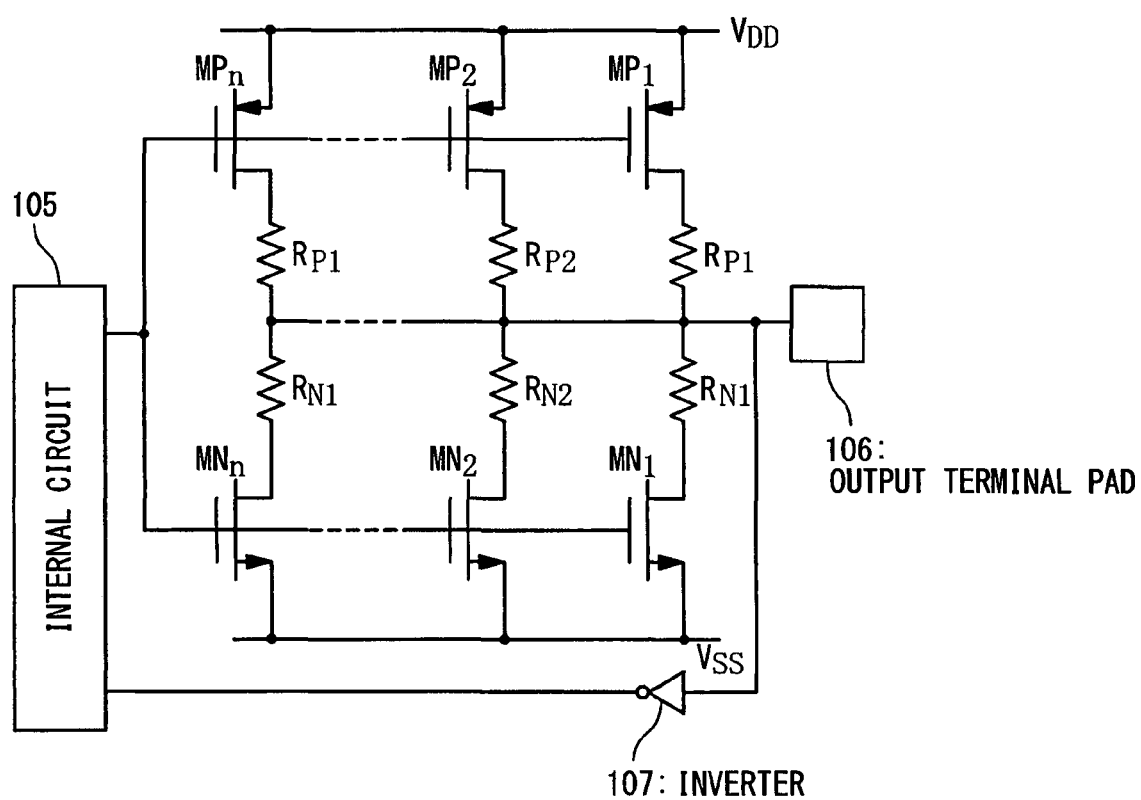
FIG. 3 is a circuit diagram showing a configuration of an output circuit according to a conventional digital circuit.
Figure 5:
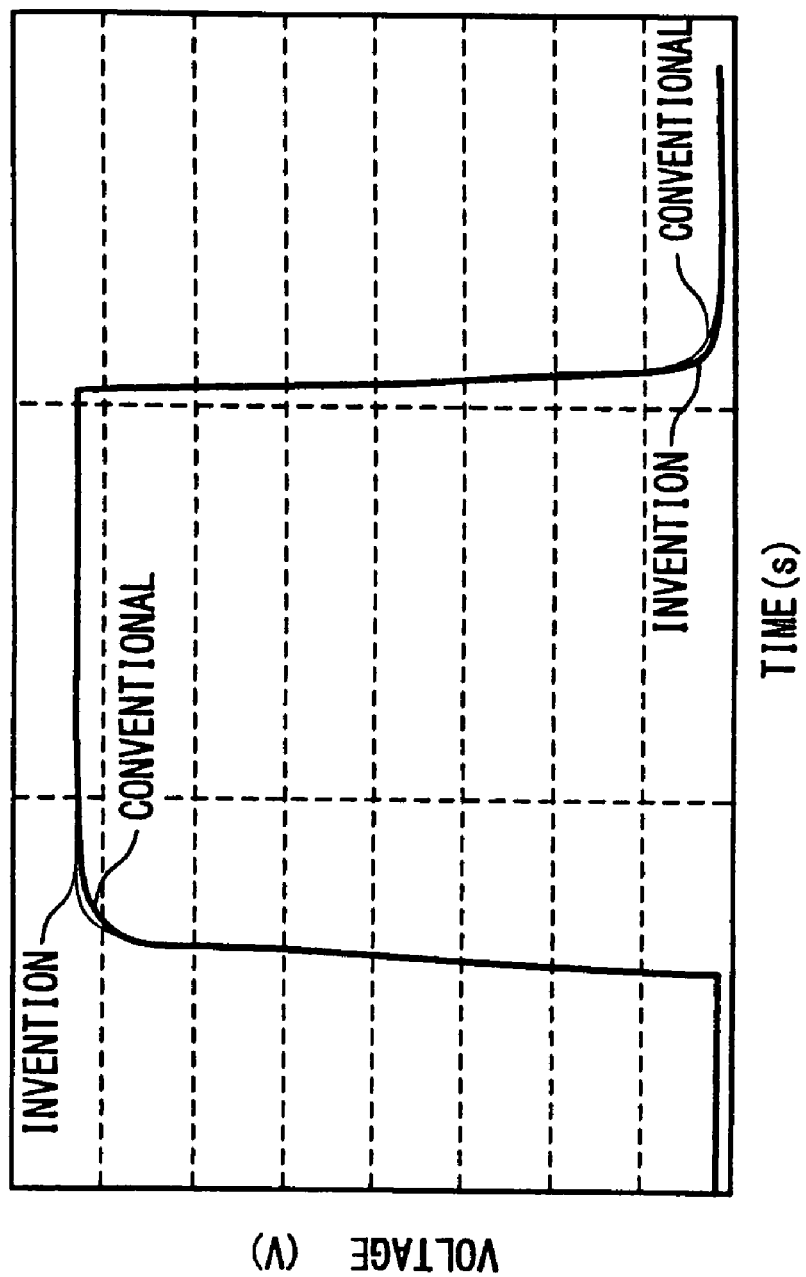
FIG. 5 is a diagram showing waveforms in the output circuit of the present invention and the output circuit of the conventional technique.

FIG. 5 shows the improvement effect. FIG. 5 shows waveform diagrams when simulations results of the circuit in the conventional example of FIG. 1 and the circuit in the present invention of FIG. 4 are superimposed. Most portions of rising waveform and rising waveform which are determined based on a through rate are almost same. However, it has been described above with reference to FIG. 2 that a so-called shoulder portion of the waveform is determined depending on the output resistance value (in this example, the electrostatic protection resistance value). Referring to FIG. 5, it could be understood that a transient characteristic of the output is improved compared to the conventional circuit. According to the drawing, the effect is shown to be small. However, it has been confirmed that an improvement effect of about 20% can be obtained in the value of 0.5%/99.5% of the output amplitude.

In addition, in the configuration of the output circuit according to the present embodiment, an offset voltage is hard to be generated. The reason is as follows. That is, in the output circuit according to the present embodiment, a voltage follower connection (specifically, a configuration to perform a feedback operation by connecting the inversion input terminal and the output) is employed. In this manner, the input voltage $V_{in}$ supplied to the non-inversion input terminal and the output voltage $V_{out}$ are equal, and $$V_{out}=V_{in}$$

In the output circuit according to the present embodiment, the feedback resistances $R_1$ and $R_2$ are provided on feedback paths. When a voltage difference is generated between the output nodes $N_{OUT1}$ and $N_{OUT2}$ due to the element variation of the MOS transistors, a current flows between the feedback resistances $R_1$ and $R_2$. Here, when the resistance values of the feedback resistances $R_1$ and $R_2$ are identical and the resistance values of the electrostatic protection resistances $R_{ESD1}$ and $R_{ESD2}$ are identical, even if a voltage difference is generated between the output nodes $N_{OUT1}$ and $N_{OUT2}$, the common connection point of the feedback resistances $R_1$ and $R_2$ connected to the inversion input terminal of the differential amplifier stage 3 and the common connection point of the electrostatic protection resistances $R_{ESD1}$ and $R_{ESD2}$ connected to the output pad 2 are in a same voltage. That is, the input voltage becomes equal to the voltage outputted to the output pad 2. This means that the offset voltage is not generated.

Second Embodiment

Figure 6:
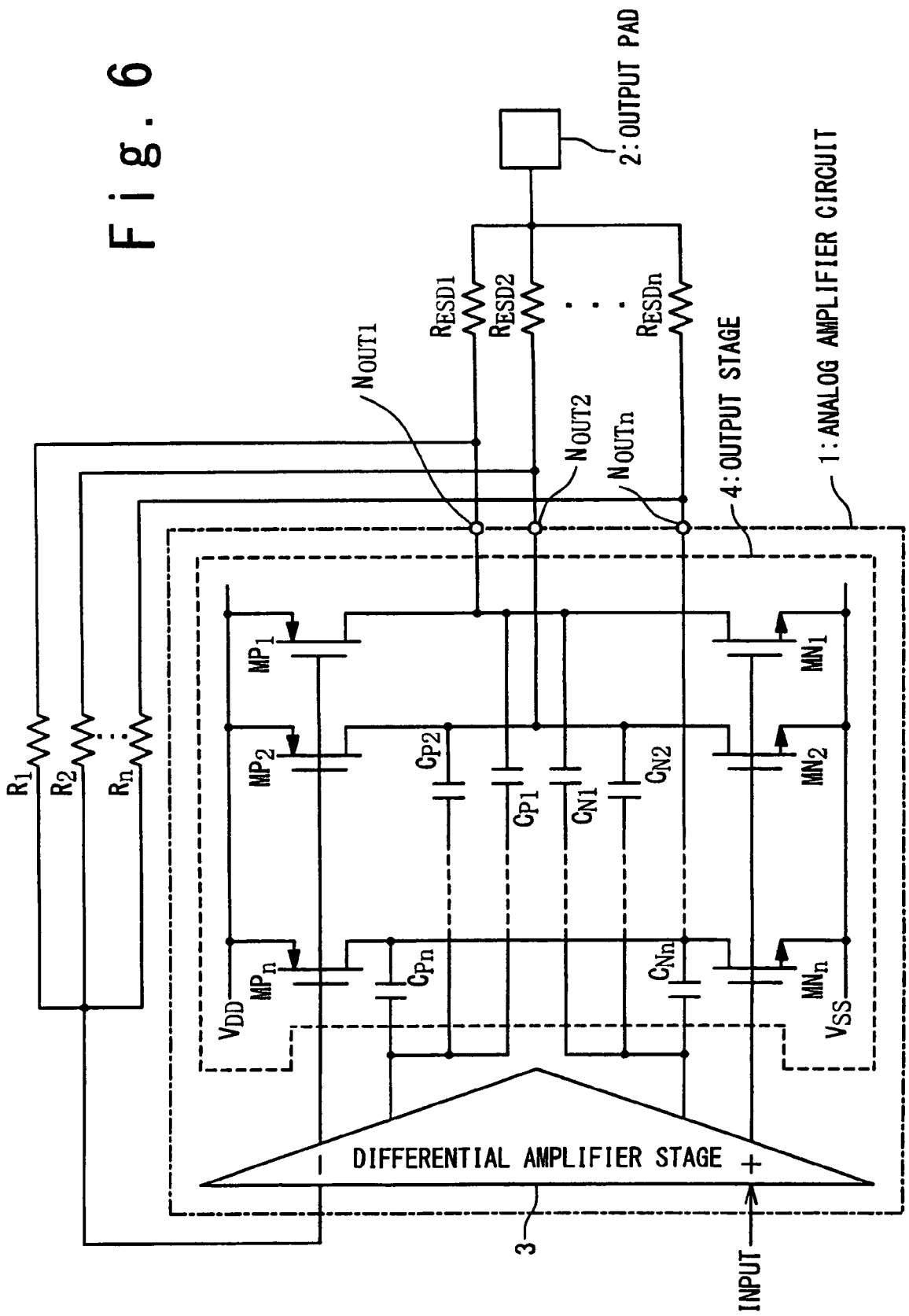
FIG. 6 is a circuit diagram showing a configuration of the output circuit according to a second embodiment of the present invention.

FIG. 6 is a circuit diagram showing a configuration of the output circuit according to a second embodiment of the present invention. The circuit configuration shown in FIG. 6 is obtained by generalizing the circuit configuration shown in FIG. 4, and has n (n is a natural number larger than 1) output systems. The circuit configuration in FIG. 4 is the example where n=2 in FIG. 6.

Specifically, in the second embodiment, the output stage 4 of, the analog amplifier circuit 1 includes n PMOS transistors $MP_1$ to $MP_n$, and n NMOS transistors $MN_1$ to $MN_n$, and these MOS transistors constitute the n output systems. The respective sources of the PMOS transistors $MP_1$ to $MP_n$ are commonly connected to the power supply having the positive power supply voltage $V_{DD}$, and the respective gates are commonly connected to one of the outputs of the differential amplifier stage 3. Meanwhile, the respective sources of the NMOS transistors $MN_1$ to $MN_n$ are commonly connected to the power supply having the negative power supply voltage $V_{SS}$, and the respective gates are commonly connected to the other of the outputs of the differential amplifier stage 3. The respective drains of the PMOS transistor $MP_i$ ($2 \leq i \leq n$) and the NMOS transistor $MN_i$ are connected to the output node $N_{OUTi}$. The $i^{th}$ electrostatic protection resistance $R_{ESDi}$ is connected between the output pad 2 and the output node $N_{outi}$. That is, the electrostatic protection resistances $R_{ESD1}$ to $R_{ESDn}$ will be commonly connected to the output pad 2 at their respective ends. The feedback resistance $R_i$ is connected between the output node $N_{OUTi}$ and the inversion input terminal of the differential amplifier stage 3. That is, the respective ends of the feedback resistances $R_1$ to $R_n$ are commonly connected to the inversion terminal of the differential amplifier stage 3. The input voltage is supplied to the non-inversion input terminal of the differential amplifier stage 3.

The output stage 4 further includes n P-side phase compensation capacitances $C_{P1}$ to $C_{Pn}$, and n N-side phase compensation capacitances $C_{N1}$ to $C_{Nn}$. The respective ends of the P-side phase compensation capacitance $C_{Pi}$ and the N-side phase compensation capacitance $C_{Ni}$ are connected to the output node $N_{OUTi}$. Meanwhile, the other ends of the P-side phase compensation capacitances $C_{P1}$ to $C_{Pn}$ are commonly connected to the differential amplifier stage 3, and similarly the other ends of the N-side phase compensation capacitances $C_{N1}$ to $C_{Nn}$ are commonly connected to the differential amplifier stage 3.

An operation of the output circuit shown in FIG. 6 is exactly the same as that in FIG. 4 in the basic concept. In the output circuit shown in FIG. 6, as the number n is increased, the resistance values of the respective electrostatic protection resistances can be reduced. That is, as understood from FIG. 2, the output waveform gets closer to an ideal waveform because the output resistance is reduced.

Third Embodiment

Figure 7:
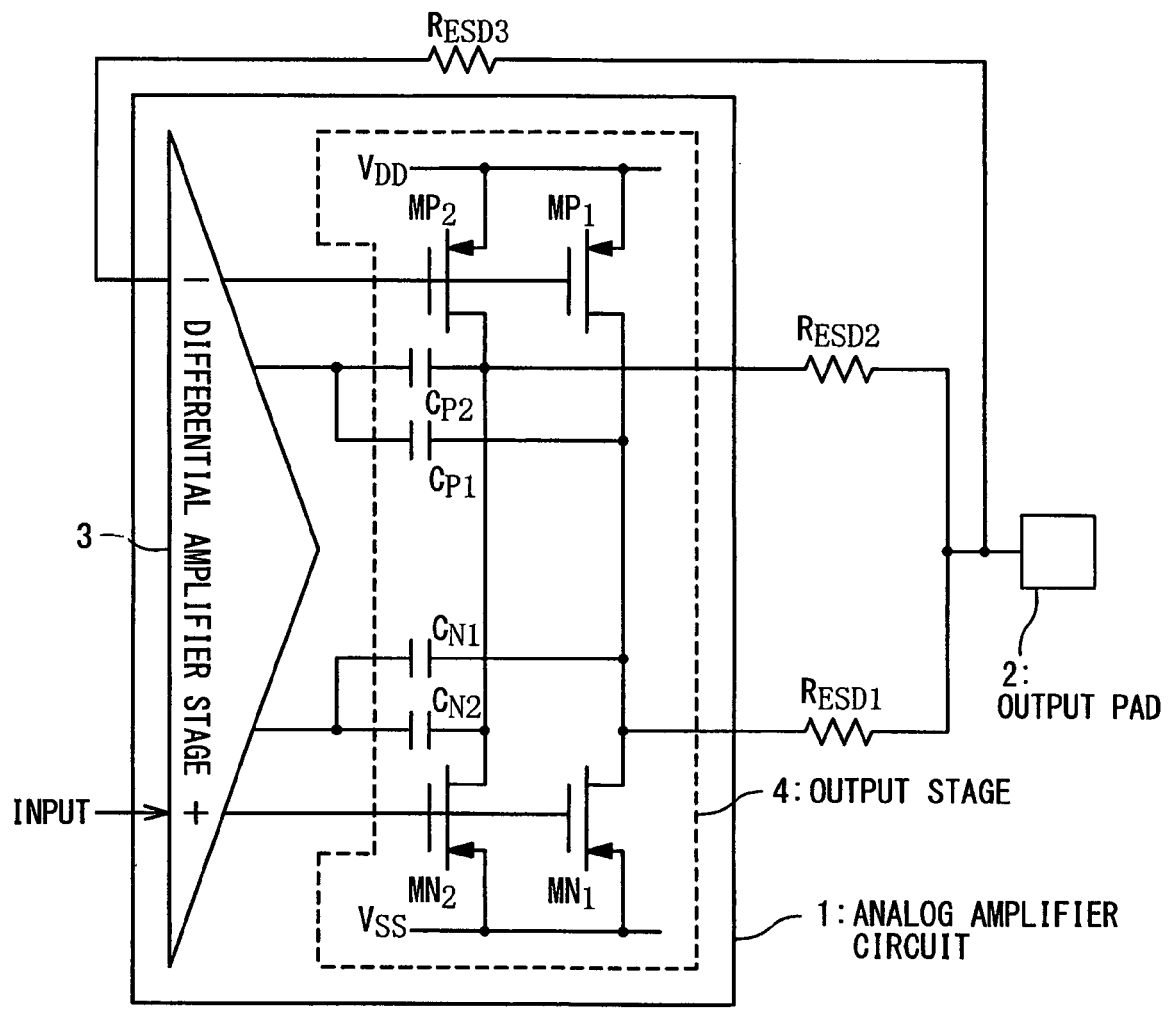
FIG. 7 is a circuit diagram showing a configuration of the output circuit according to a third embodiment of the present invention.

Referring to FIG. 7, a configuration of an output circuit according to a third embodiment of the present invention will be described. In the output circuit according to the third embodiment, the feedback input point is changed from that in the first embodiment (referring to FIG. 4). Specifically, the feedback resistances $R_1$ and $R_2$ in FIG. 4 are removed, and instead of these elements, a third electrostatic protection resistance $R_{EDS3}$ is provided between the inversion input terminal of the differential amplifier stage 3 and the output pad 2. The remaining configuration is exactly the same as that in the first embodiment (FIG. 4). It should be note that a configuration in which the feedback resistances $R_1$ to $R_n$ are removed, one end of the third electrostatic protection resistance $R_{EDS3}$ is connected to the inversion input terminal of the differential amplifier stage 3, and the other end of the third electrostatic protection resistance $R_{EDS3}$ is connected to the output pad 2 can be applied to the output circuit shown in FIG. 6.

An operation of the output circuit according to the third embodiment will be described below. In the output circuit according to the third embodiment, an influence of the electrostatic protection resistances $R_{EDS1}$ and $R_{EDS2}$ is reduced without limit by changing the feedback input point. That is, an output impedance including that of the electrostatic protection resistance is compressed to $1/(\mu\beta)$ times by introducing the electrostatic protection resistances $R_{EDS1}$ and $R_{EDS2}$ into the feedback loop, where $\mu$ is a gain of the analog amplifier circuit 1, and $\beta$ is a feedback rate (since the feedback rate of the voltage follower is 1, $\beta$ is equal to 1 ($\beta$=1) in this case). When the gain of the analog amplifier circuit 1 is sufficiently large, a direct current impedance viewed from the output pad 2 becomes almost zero. In addition, since a current does not flow through the electrostatic protection resistance $R_{EDS3}$, the input voltage and the output voltage outputted to the output pad 2 are a same voltage. On this occasion, in the inversion input terminal of the differential amplifier stage 3, an electrostatic protective standard is satisfied by the electrostatic protection resistance $R_{EDS3}$. Since the remaining operation is exactly the same as those in the above-mentioned first embodiment and second embodiment, the explanation is omitted.

The embodiments of the present invention have been variously described above. However, the present invention shall not be interrupted, being limited to the above-mentioned embodiments. It should be note that various modifications obvious to a person skilled in the art can be applied to the present invention.

What is claimed is:

1. An output circuit comprising:
    an analog amplifier circuit which comprises:
        a differential amplifier stage configured to receive an input voltage, and
        first to $n^{th}$ output systems (n is a natural number more than 1);
    first to $n^{th}$ output nodes;
    an output pad; and
    first to $n^{th}$ electrostatic protection resistances,
    wherein an $i^{th}$ output system (i is a natural number between 2 and n) of said first to $n^{th}$ output systems comprises:
        an $i^{th}$ PMOS transistor having a drain connected with said $i^{th}$ output node of said first to $n^{th}$ output nodes and a gate connected with a first output of said differential amplifier stage; and
        an $i^{th}$ NMOS transistor having a drain connected with said $i^{th}$ output node and a gate connected with a second output of said differential amplifier stage, and
    wherein said first to $n^{th}$ electrostatic protection resistances are respectively connected between said first to $n^{th}$ output nodes and said output pad.

2. The output circuit according to claim 1, further comprising:
    first to $n^{th}$ feedback resistances,
    wherein said differential amplifier stage comprises a non-inversion input terminal configured to receive the input voltage and an inversion input terminal, and
    wherein said first to $n^{th}$ feedback resistances are respectively connected between said first to $n^{th}$ output nodes and said inversion input terminal.

3. The output circuit according to claim 1, further comprising:
    first to $n^{th}$ P-side phase compensation capacitances; and
    first to $n^{th}$ N-side phase compensation capacitances,
    wherein respective one ends of said first to $n^{th}$ P-side phase compensation capacitances are respectively connected with said first to $n^{th}$ output nodes, and respective one ends of said first to $n^{th}$ N-side phase compensation capacitances are respectively connected with said first to $n^{th}$ output nodes, and
    wherein the other ends of an $i^{th}$ P-side compensation capacitance of said first to $n^{th}$ P-side phase compensation capacitances and an $i^{th}$ N-side compensation capacitance of said first to $n^{th}$ P-side phase compensation capacitances are respectively connected with said first and second outputs of said differential amplifier stage.

4. The output circuit according to claim 1, further comprising:
    a $(n+1)^{th}$ electrostatic protection resistance,
    wherein said differential amplifier stage comprises a non-inversion input terminal configured to receive the input voltage and an inversion input terminal, and
    wherein said $(n+1)^{th}$ electrostatic protection resistances is connected between said output pad and said inversion input terminal.

5. The output circuit according to claim 1, wherein the resistance values of the said first to $n^{th}$ electrostatic protection resistances are substantially the same.

6. The output circuit according to claim 1, further comprising:
    first to $n^{th}$ feedback resistances,
    wherein said first to $n^{th}$ feedback resistances are respectively connected between said first to $n^{th}$ output nodes and an inversion input terminal of said differential amplifier stage, and
    wherein a voltage at a common connection point of the feedback resistances and an input voltage of the non-inversion input terminal are equal to each other.

7. The output circuit according to claim 1, further comprising:
first to $n^{th}$ feedback resistances,
wherein said first to $n^{th}$ feedback resistances are respectively connected between said first to $n^{th}$ output nodes and an inversion input terminal of said differential amplifier stage.

8. The output circuit according to claim 1, further comprising:
first to $n^{th}$ P-side phase compensation capacitances; and
first to $n^{th}$ N-side phase compensation capacitances.

9. The output circuit according to claim 1, further comprising:
first to $n^{th}$ P-side phase compensation capacitances; and
first to $n^{th}$ N-side phase compensation capacitances,
wherein respective one ends of said first to $n^{th}$ P-side phase compensation capacitances are respectively connected with said first to $n^{th}$ output nodes, and respective one ends of said first to $n^{th}$ N-side phase compensation capacitances are respectively connected with said first to $n^{th}$ output nodes.

10. The output circuit according to claim 1, further comprising:
a $(n+1)^{th}$ electrostatic protection resistance,
wherein said $(n+1)^{th}$ electrostatic protection resistance is connected between said output pad and an inversion input terminal of said differential amplifier stage.

11. An output circuit comprising:
an analog amplifier circuit which comprises:
a differential amplifier stage configured to receive an input voltage, and
first to $n^{th}$ output systems (n is a natural number more than 1);
first to $n^{th}$ output nodes;
an output pad;
first to $n^{th}$ electrostatic protection resistances,
wherein an $i^{th}$ output system (i is a natural number between 2 and n) of said first to $n^{th}$ output systems comprises:
an $i^{th}$ PMOS transistor having a drain connected with said $i^{th}$ output node of said first to $n^{th}$ output nodes and a gate connected with a first output of said differential amplifier stage; and
an $i^{th}$ NMOS transistor having a drain connected with said $i^{th}$ output node and a gate connected with a second output of said differential amplifier stage, and
wherein said first to $n^{th}$ electrostatic protection resistances are respectively connected between said first to $n^{th}$ output nodes and said output pad; and
first to $n^{th}$ feedback resistances are respectively connected between said first to $n^{th}$ output nodes and an input terminal of the differential amplifier stage.

12. The output circuit according to claim 11, wherein said first to $n^{th}$ feedback resistances are respectively connected between said first to $n^{th}$ output nodes and the input terminal comprising an inversion input terminal.

13. The output circuit according to claim 11, further comprising:
first to $n^{th}$ P-side phase compensation capacitances; and
first to $n^{th}$ N-side phase compensation capacitances.

14. The output circuit according to claim 13, wherein respective one ends of said first to $n^{th}$ P-side phase compensation capacitances are respectively connected with said first to $n^{th}$ output nodes, and respective one ends of said first to $n^{th}$ N-side phase compensation capacitances are respectively connected with said first to $n^{th}$ output nodes.

15. The output circuit according to claim 14, wherein the other ends of an $i^{th}$ P-side compensation capacitance of said first to $n^{th}$ P-side phase compensation capacitances and an $i^{th}$ N-side compensation capacitance of said first to $n^{th}$ P-side phase compensation capacitances are respectively connected with said first and second outputs of said differential amplifier stage.

16. The output circuit according to claim 11, further comprising a $(n+1)^{th}$ electrostatic protection resistance.

17. The output circuit according to claim 16, wherein said differential amplifier stage comprises a non-inversion input terminal configured to receive the input voltage and an inversion input terminal.

18. The output circuit according to claim 16, wherein said $(n+1)^{th}$ electrostatic protection resistance is connected between said output pad and said inversion input terminal.

* * * * *